(12) United States Patent
Chen et al.

(10) Patent No.: US 11,418,159 B2
(45) Date of Patent: Aug. 16, 2022

(54) DIFFERENTIAL SIGNAL OFFSET ADJUSTMENT CIRCUIT AND DIFFERENTIAL SYSTEM

(71) Applicant: Grace Connection Microelectronics Limited, Zhubei (TW)

(72) Inventors: Pei Wei Chen, Taipei (TW); Hsien-Ku Chen, Zhubei (TW)

(73) Assignee: GRACE CONNECTION MICROELECTRONICS LIMITED, Zhubei (TW)

( * ) Notice: Subject to any disclaimer, the term of this patent is extended or adjusted under 35 U.S.C. 154(b) by 0 days.

(21) Appl. No.: 17/147,470

(22) Filed: Jan. 13, 2021

(65) Prior Publication Data

US 2021/0218378 A1 Jul. 15, 2021

(30) Foreign Application Priority Data

Jan. 14, 2020 (TW) .................................. 109101128

(51) Int. Cl.
*H03F 3/45* (2006.01)
*H03F 1/02* (2006.01)

(52) U.S. Cl.
CPC ..... *H03F 3/4508* (2013.01); *H03F 2200/375* (2013.01)

(58) Field of Classification Search
CPC ............. H03F 3/4508; H03F 2200/375; H03F 2203/45612; H03F 3/45098; H03F 3/456; H03F 3/45973; H03F 2203/45212; H03F 3/45475

USPC .......................................... 330/252–261, 310
See application file for complete search history.

(56) References Cited

U.S. PATENT DOCUMENTS 7,420,410 B2 * 9/2008 Ohba .................. H03F 3/45977
330/253

* cited by examiner

*Primary Examiner* — Hieu P Nguyen
(74) *Attorney, Agent, or Firm* — TOMANAGEIP

(57) ABSTRACT

The present invention provides a differential signal offset adjustment circuit, wherein first and second transistors are respectively coupled between a power supply line and a first current source, and between the power supply line and a second current source. First and second resistors are respectively coupled between the first transistor and a first variable current source, and between the second transistor and a second variable current source. Third and fourth transistors are respectively coupled between a third resistor and a third current source, and between a fourth resistor and a fourth current source, and have input terminals respectively coupled to the first and second resistors. Fifth and sixth transistors are respectively coupled between the power supply line and a fifth current source, and between the power supply line and a sixth current source, and have input terminals respectively coupled to the third and fourth transistors. A fifth resistor is coupled between the third and fourth current sources.

20 Claims, 5 Drawing Sheets

DIFFERENTIAL SIGNAL OFFSET ADJUSTMENT CIRCUIT AND DIFFERENTIAL SYSTEM

CROSS REFERENCE

THE present invention claims priority to TW109101128, filed on Jan. 14, 2020.

BACKGROUND OF THE INVENTION

Field of Invention

The present invention relates to a differential circuit, and particularly relates to a differential signal offset adjustment circuit.

Description of Related Art

Differential amplifiers are applied to many purposes. The differential amplifier is usually utilized in an operational amplifier, and the operational amplifier is often utilized in electronic products. For example, the differential amplifier can read the stored data from the memory array. The differential amplifier can also be applied to the analog portion of electronic products.

The offset of the differential amplifier affects the performance of the differential amplifier. The offset of the differential amplifier, is an error caused by the difference in the physical design or manufacturing process of the differential amplifier. For example, the threshold of the components in the circuit, the mismatch of component size, etc., may cause the offset errors.

Therefore, in order to prevent the offset from affecting the normal operation of the circuit, a circuit that can adjust the offset of the differential signal is required.

SUMMARY OF THE INVENTION

In view of the above, the present invention provides a differential signal offset adjustment circuit. Therein, a first transistor is coupled between a power supply line and a first current source, and the first transistor has an input terminal for receiving a first input signal. A second transistor is coupled between the power supply line and a second current source, and the second transistor has an input terminal for receiving a second input signal, wherein the first signal and the second signal are complementary. A first resistor is coupled between the first transistor and a first variable current source. A second resistor is coupled between the second transistor and a second variable current source. A third resistor is coupled between the power supply line and a third current source. A fourth resistor is coupled between the power supply line and a fourth current source. A third transistor is coupled between the third resistor and the third current source, and the third transistor has an input terminal coupled to the first resistor and the first variable current source. A fourth transistor is coupled between the fourth resistor and the fourth current source, and the fourth transistor has an input terminal coupled to the second resistor and the second variable current source. A fifth transistor is coupled between the power supply line and a fifth current source to provide a first output signal, and the fifth transistor has an input terminal coupled to the third resistor and the third transistor. A sixth transistor is coupled between the power supply line and a sixth current source to provide a second output signal, and the sixth transistor has an input terminal coupled to the fourth resistor and the fourth transistor. At least one fifth resistor is coupled between the third current source and the fourth current source.

In one embodiment, the first current source and the second current source provide the same current values, the third current source and the fourth current source provide the same current values, and the fifth current source and the sixth current source provide the same current values.

Furthermore, the present invention provides a differential system, which includes a differential amplifier, a differential signal offset adjustment circuit, and a control circuit. The differential amplifier generates a second differential signal pair according to a first differential signal pair. The differential signal offset adjustment circuit generates a third differential signal pair according to the second differential signal pair, wherein the differential signal offset adjustment circuit includes a first variable current source and a second variable current source. The control circuit detects a cross point of the third differential signal, and provides a first control signal and a second control signal according to the detected cross point, to the differential signal offset adjustment circuit for adjustment the cross point of the third differential signal pair. The first variable current source provides a first variable current according to the first control signal, and the second variable current source provides a second variable current according to the second control signal.

The objectives, technical details, features, and effects of the present invention will be better understood with regard to the detailed description of the embodiments below, with reference to the attached drawings.

DESCRIPTION OF THE PREFERRED EMBODIMENTS

According to the above and other objects, features, and benefits of the present invention, the following preferred embodiments, combined with the accompanying drawings, and detailed descriptions are as follows.

Figure 1:
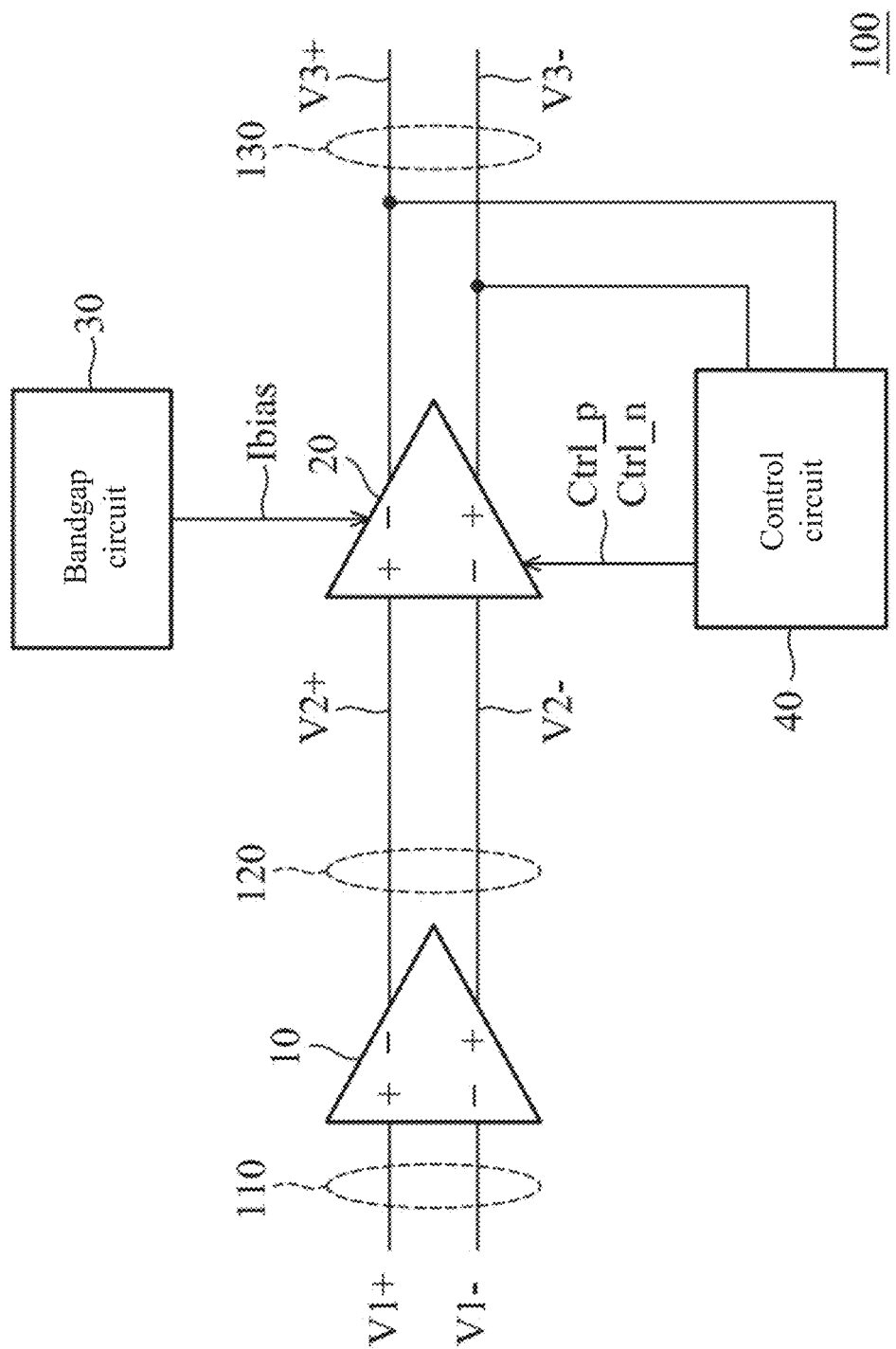
FIG. 1 shows a differential system according to several embodiments of the present invention.

FIG. 1 shows a differential system 100 according to the present invention. The differential system 100 includes a differential amplifier 10, a differential signal offset adjustment circuit 20, a bandgap circuit 30, and a control circuit 40. The differential amplifier 10 can receive a first pair of differential signals 110 (hereinafter referred to as a first differential signal pair) composed of signals V1+ and V1−, and generates a second pair of differential signals 120 (hereinafter referred to as a second differential signal pair) composed of signals V2+ and V2−. Generally, the differential signal includes two signals have the same amplitudes and opposite phases; that is, the two complementary signals. Therefore, the signal V1+ and the signal V1− have the same amplitudes and opposite phases, and the signal V2+ and the signal V2− have the same amplitudes and opposite phases.

In several embodiments, the signal V2+ and the signal V1− have the same phase, and the signal V2− and the signal V1+ have the same phase. The differential signal offset adjustment circuit 20 can receive the second differential signal pair 120, to generate a third pair of differential signals 130 (hereinafter referred to as a third differential signal pair) composed of signals V3+ and V3−. The differential signal offset adjustment circuit 20 adjusts a cross point of the signals V3+ and V3−, according to a control signal Ctrl_p and a control signal Ctrl_n from the control circuit 40; that is, the offset therein. For example, when the control circuit 40 detects that the cross point of the signal V3+ and the signal V3− is lower than a predetermined value, it can provide control signals Ctrl_p and Ctrl_n to the differential signal offset adjustment circuit 20, to raise the cross point to the predetermined value. In several embodiments, the cross point of the signal V3+ and the signal V3− can be configured to be a threshold voltage. In addition, the bandgap circuit 30 can provide a bias current Ibias to the differential signal offset adjustment circuit 20. Generally, the bandgap circuit 30 is applied to generate an accurate reference voltage or reference current. The reference voltage or the reference current generated by the bandgap circuit 30 is not affected by the process, power supply and temperature changes, so that problems caused by corner effects can be avoided.

Figure 2:
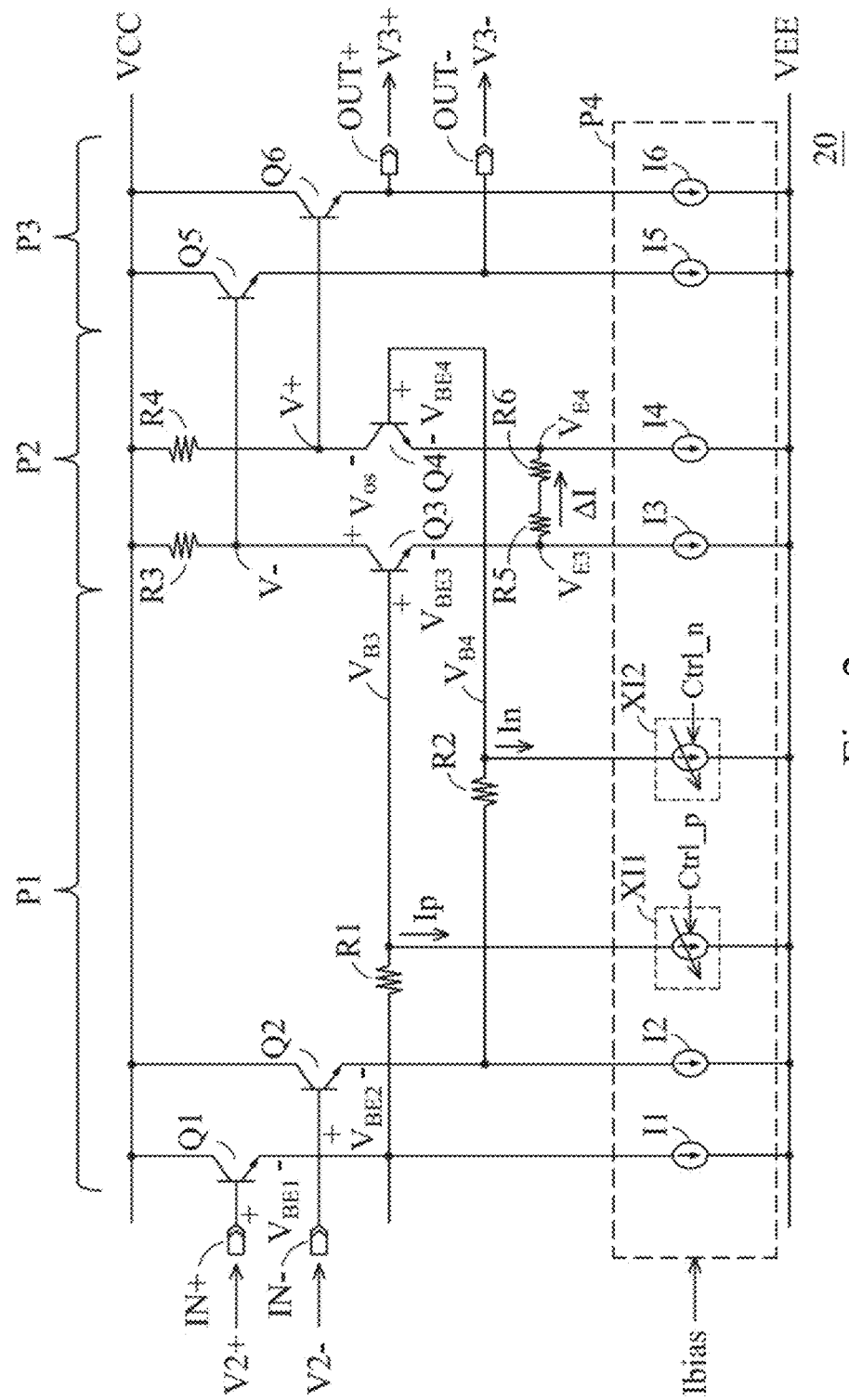
FIG. 2 shows a differential signal offset adjustment circuit according to several embodiments of the present invention.

FIG. 2 shows a differential signal offset adjustment circuit 20 according to the present invention. The differential signal offset adjustment circuit 20 includes a cross point control portion P1, an amplifier portion P2, and a buffer portion P3. The cross point control portion P1 includes transistors Q1 and Q2, resistors R1 and R2, current sources I1 and I2, and variable current sources XI1 and XI2. The amplifier portion P2 includes transistors Q3 and Q4, resistors R3, R4, R5, R6, and current sources I3 and I4. The buffer portion P3 includes transistors Q5 and Q6 and current sources I5 and I6. In FIG. 2, the transistors Q1-Q6 are, for example, NPN bipolar transistors (BJT). In other embodiments, the transistors Q1-Q6 can be metal oxide semiconductor field effect transistors (MOSFET) or other types of field effect transistors. In several embodiments, the currents provided by the current sources I1-I6 and the variable current sources XI1 and XI2 are generated by mirroring a bias current Ibias, for example, by the current mirror portion P4. As mentioned therebefore, the bias current Ibias provided by the bandgap circuit 30 cannot be affected by process, power supply, and temperature changes. In addition, in the integrated circuit, generating an electric current by the current mirroring technique is a known technique, and it is not detailed herein. The resistors R1-R6 and the resistor(s) in the bandgap circuit 30 are formed of the same materials. In several embodiments, the resistors R1-R6 are substantially formed of polysilicon.

In the cross point control portion P1, the transistor Q1 is coupled between the power supply line VCC and the current source I1, and the transistor Q2 is coupled between the power supply line VCC and the current source I2. The transistor Q1 and the transistor Q2 have the same dimension and matching layouts. The current source I1 is coupled between the transistor Q1 and the power supply line VEE, and the current source I2 is coupled to the transistor Q2 and the power supply line between VEE. The power supply line VCC is configured to provide a high-level voltage, and the power supply line VEE is configured to provide a low-level voltage. In several embodiments, the power supply line VEE may be ground (GND). In several embodiments, the current source I1 and the current source I2 can respectively draw currents with the same current values from the transistor Q1 and the transistor Q2. The base of the transistor Q1 is coupled to an input terminal IN+ to receive the signal V2+ from the differential amplifier 10 in FIG. 1. The base of the transistor Q2 is coupled to the input terminal IN− to receive the signal V2− from the differential amplifier 10 shown in FIG. 1. As mentioned therebefore, the signal V2+ and the signal V2− are differential signals. The resistor R1 is coupled between the transistor Q1 and the variable current source XI1, and the resistor R2 is coupled to the transistor Q2 and the variable current source XI2. The control signal Ctrl_p can control a current value of the current Ip drawn through the resistor R1 by the variable current source XI1, and the control signal Ctrl_n can control a current value of the current In drawn through the resistor R2 by the variable current source XI2. In other words, the current value of the current Ip flowing through the resistor R1 is determined by the control signal Ctrl_p, and the current value of the current In flowing through the resistor R2 is determined by the control signal Ctrl_n. In addition, the resistor R1 and the resistor R2 have the same resistance values. The current sources I1 and I2 and the variable current sources XI1 and XI2 are only examples, which are not to limit the scope of the present invention. Any circuit that can provide a fixed current in the path through the transistor Q1 and Q2 can be applied to the current sources I1 and I2. Any circuit that can provide a variable current in the path through the resistors R1 and R2, is applicable in the variable current sources XI1 and XI2. Besides, the control signals Ctrl_p and Ctrl_n can be digital signals or analog signals, and the variable current sources XI1 and XI2 have the same and matched layout. In several embodiments, each of the variable current sources XI1 and XI2 includes a plurality of current sources, wherein each of the current sources is coupled to a corresponding resistors R1 and R2 through separate switches, and the control signals Ctrl_p and Ctrl_n are utilized to control whether these switches are conducted.

In the amplifier portion P2, the resistor R3 is coupled between the power supply line VCC and the transistor Q3, and the resistor R4 is coupled between the power supply line VCC and the transistor Q4. Transistors Q3 and Q4 have the same dimension and matching layouts. In addition, the resistors R3 and R4 have the same resistance values. The current source I3 is coupled between the transistor Q3 and the power supply line VEE, and the current source I4 is coupled to the transistor Q4 and the power supply line between VEE. The resistors R5 and R6 are connected in series between the emitter of the transistor Q3 and the emitter of the transistor Q4, and the resistors R5 and R6 have the same resistance values. In several embodiments, the resistors R5 and R6 can be integrated into a single resistor. Please note that the current sources I3 and I4 are only illustrative examples, and are not to limit the scope of the present invention. Any circuit that can provide a fixed current in the path of the transistor Q3 and Q4 can be applied to the current sources I3 and I4. In this embodiment, the amplifier portion P2 can be utilized as a common emitter amplifier circuit (CE amplifier circuit).

In the buffer portion P3, the transistor Q5 is coupled between the power supply line VCC and an output terminal OUT−, and the transistor Q6 is coupled between the power supply line VCC and an output terminal OUT+. The transistor Q5 and the transistor Q6 have the same dimension and matching layouts. The current source I5 is coupled between the output terminal OUT− and the power supply line VEE, and the current source I6 is coupled between the output terminal OUT+ and the power supply line VEE. In several embodiments, the current source I5 and the current source I6 can draw currents with the same current values from the transistors Q5 and Q6.

In the differential signal offset adjustment circuit 20, the base voltage $V_{B3}$ of the transistor Q3 and the base voltage $V_{B4}$ of the transistor Q4 can be obtained in the following formula:

$$V_{B3} = V2_+ - V_{BE1} - Ip \times R_{XP},$$

$$V_{B4} = V2_- - V_{BE2} - In \times R_{XP};$$

wherein, $V_{BE1}$ represents the base-emitter voltage of the transistor Q1, and $V_{BE2}$ represents the base-emitter voltage of the transistor Q2. In addition, $R_{XP}$ represents the resistance values of the resistors R1 and R2. Ip is the current value flowing through the resistor R1, which is controlled by the control signal Ctrl_p. Furthermore, In is the current value flowing through the resistor R2, which is controlled by the control signal Ctrl_n.

In the differential signal offset adjustment circuit 20, the emitter voltage $V_{E3}$ of the transistor Q3 and the emitter voltage $V_{E4}$ of the transistor Q4 can be obtained in the following formula:

$$V_{E3} = V_{B3} - V_{BE3} = V2_+ - V_{BE1} - V_{BE3} - Ip \times R_{XP},$$

$$V_{E4} = V_{B4} - V_{BE4} = V2_- - V_{BE2} - V_{BE4} - In \times R_{XP};$$

wherein, $V_{BE3}$ is the base-emitter voltage of transistor Q3, and $V_{BE4}$ is the base-emitter voltage of transistor Q4.

According to the following formula, the current difference $\Delta I$ between the two emitters of the transistor Q3 and Q4 can be obtained as:

$$V_{E3} - V_{E4} \approx -(Ip - In) \times R_{XP},$$

$$\Delta I = \frac{V_{E3} - V_{E4}}{2 \times R_{LIN}} \approx \frac{-(Ip - In) \times R_{XP}}{2 \times R_{LIN}};$$

wherein, $R_{LIN}$ is the resistance value of the resistors R5 and R6.

According to the current difference $\Delta I$ and the following formula, an offset voltage Vos between the two collectors of the transistor Q3 and Q4 can be obtained as:

$$V_+ = VCC - (I_{biasxp} - \Delta I) \times R_L,$$

$$V_- = VCC - (I_{biasxp} + \Delta I) \times R_L,$$

$$V_{os} = V_+ - V_- = 2 \times \Delta I \times R_L \approx \frac{-(Ip - In) \times R_{XP} \times R_L}{R_{LIN}};$$

wherein, $R_L$ is the resistance value of the resistors R3 and R4, Ibiasxp is the current value of the current sources I3 and I4. In addition, V− is the collector voltage of the transistor Q3, and V+ is the collector voltage of the transistor Q4.

In the differential signal offset adjustment circuit 20, a gain G is determined by the amplifier portion P2. Based on the direct current (DC), the base-emitter voltage $V_{BE3}$ of the transistor Q3 is substantially equal to the base-emitter voltage $V_{BE4}$ of the transistor Q4. Therefore, the current difference $\Delta I$ can be obtained by the following formula:

$$\Delta I = \frac{V_{E3} - V_{E4}}{2 \times R_{LIN}} \approx \frac{V_{B3} - V_{B4}}{2 \times R_{LIN}}.$$

According to the current difference $\Delta I$ and the following formula, the gain G of the differential signal offset adjustment circuit 20 can be obtained:

$$V_+ - V_- = 2 \times \Delta I \times R_L \approx 2 \times \frac{V_{B3} - V_{B4}}{2 \times R_{LIN}} \times R_L = \frac{V_{B3} - V_{B4}}{R_{LIN}} \times R_L;$$

$$G = \frac{V_+ - V_-}{V_{B3} - V_{B4}} = \frac{R_L}{R_{LIN}}.$$

Therefore, by adjusting the ratio of the resistance $R_L$ (the resistors R3 and R4) and the resistance $R_{LIN}$ (the resistors R5 and R6), the gain G of the differential signal offset adjustment circuit 20 can controlled.

As mentioned above, the offset voltage Vos is related to the currents Ip and In, and the current values of the currents Ip and In are respectively determined by the variable current sources XI1 and XI2 controlled according to the control signals Ctrl_p and Ctrl_n. In several embodiments, the control signals Ctrl_p and Ctrl_n are provided by the control circuit 40. In another embodiment, the control signals Ctrl_p and Ctrl_n are provided by other circuits. In several embodiments, the control signals Ctrl_p and Ctrl_n are provided by a user. The offset voltage Vos can be utilized as a voltage difference between the cross point XP of the signal V3+ and the signal V3− and the common mode voltage Vcm. In several embodiments, the common mode voltage Vcm is an average voltage of the power supply line VCC and the power supply line VEE; that is, Vcm=(VCC+VEE)/2.

Figure 3A:
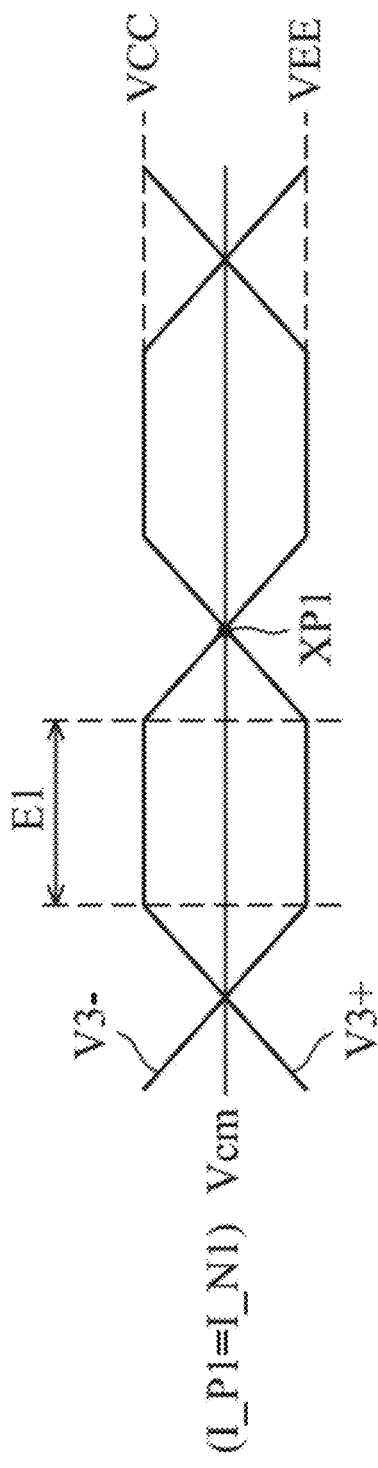
FIGS. 3A-3E show the eye diagrams of the output signals V3+ and V3− of the differential signal offset adjustment circuit according to several embodiments of the present invention.

FIG. 3A shows an eye diagram of the output signals V3+ and V3− of the differential signal offset adjustment circuit 20 according to several embodiments of the present invention. In FIG. 3A, the control signals Ctrl_p and Ctrl_n can control the variable current sources XI1 and XI2, so that the current value I_P1 of the current Ip is equal to the current value I_N1 of the current In (that is, I_P1=I_N1). Therefore, the cross point XP1 of the signal V3+ and the signal V3− can be equal to the common mode voltage Vcm. Therefore, when the current values I_P1 and I_N1 are the same, there is no offset voltage Vos between the cross point XP and the common mode voltage Vcm. The period during maintaining the signal V3+ at the voltage of the power supply line VCC is E1. In several embodiments, for an operating circuit as a next stage to the differential signal offset adjustment circuit 20, the period E1 means the optimal sampling period of the signal V3+.

When the current value I_P1 of the current Ip is equal to the current value I_N1 of the current In, and the cross point XP1 of the signal V3+ and the signal V3− is not equal to the common mode voltage Vcm, the differential signal offset adjustment circuit 20 has an offset. As mentioned therebefore, the offset is an error caused by the physical design of the circuit or manufacturing process deviation. Therefore, in several embodiments, with adjusting the current value of the currents Ip and In by using the control signals Ctrl_p and Ctrl_n, the cross point of the control signal V3+ and the signal V3− can be equal to the common mode voltage Vcm.

Figure 3B:
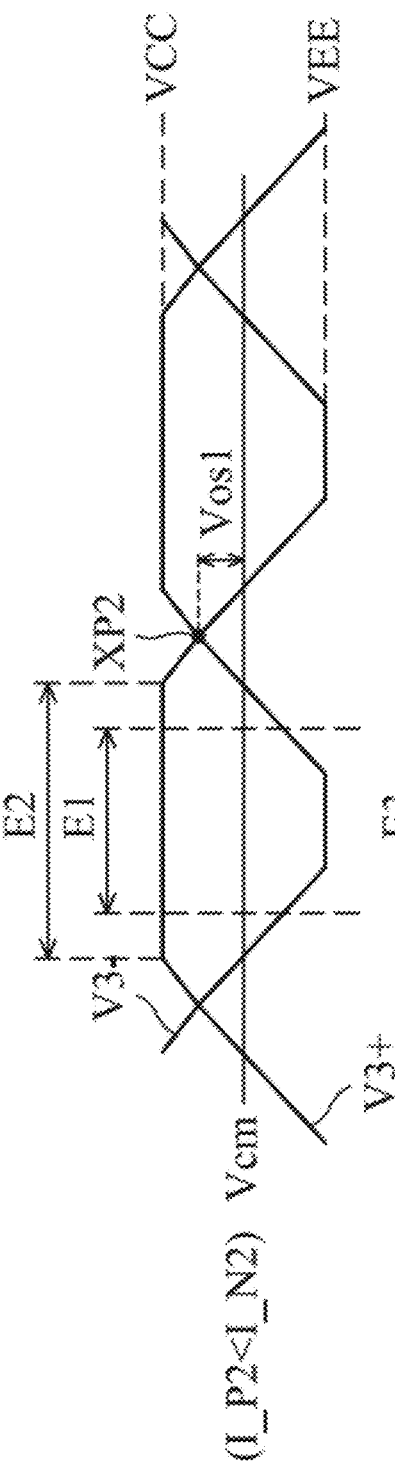

FIG. 3B shows the eye diagram of the output signals V3+ and V3− of the differential signal offset adjustment circuit 20 according to several embodiments of the present invention. In FIG. 3B, the control signals Ctrl_p and Ctrl_n can control the variable current sources XI1 and XI2, so that the current value I_P2 of the current Ip can be less than the current value I_N2 of the current In; that is, I_P2<I_N2. Therefore, the cross point XP2 of the signal V3+ and the signal V3− can be higher than the common mode voltage Vcm. Therefore, there is a positive offset voltage Vos1 between the cross point XP and the common mode voltage Vcm; that is, Vos1>0. In addition, the period during maintaining the signal V3+ at the voltage of the power supply line VCC is E2, and E2>E1.

Figure 3C:
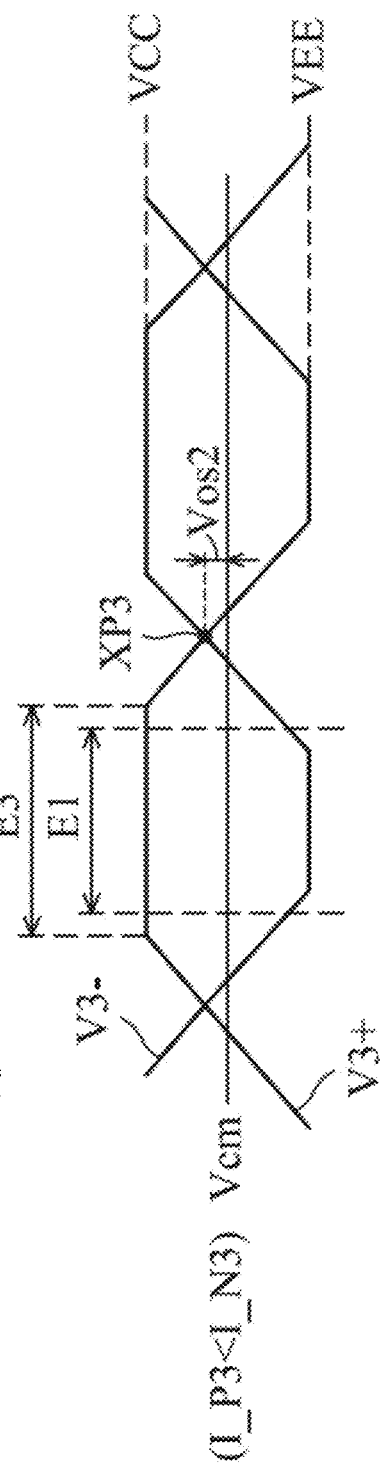

FIG. 3C shows the eye diagram of the output signals V3+ and V3− of the differential signal offset adjustment circuit 20 according to several embodiments of the present invention. In FIG. 3C, the control signals Ctrl_p and Ctrl_n can control the variable current sources XI1 and XI2, so that the current value I_P3 of the current Ip can be less than the current value I_N3 of the current; that is, I_P3<I_N3. Therefore, the cross point XP3 of the signal V3+ and the signal V3− can be higher than the common mode voltage Vcm. For the current Ip, the current value I_P2 in FIG. 3B is lower than the current value I_P3 in FIG. 3C; that is, I_P2<I_P3. Furthermore, for the current In, the current value I_N2 in FIG. 3B is higher than the current value I_N3 in FIG. 3C; that is, I_N2>I_N3. The cross point XP and the common mode voltage Vcm have a positive offset voltage Vos2, and the offset voltage Vos2 is lower than the offset voltage Vos1 of FIG. 3B; that is, Vos1>Vos2>0. The period during maintaining the signal V3+ at the voltage of the power supply line VCC is E3, and the period E3 is longer than the period E1 and shorter than the period E2; that is, E2> E3>E1.

When the control signals Ctrl_p and Ctrl_n of the differential signal offset adjustment circuit 20 are switched from the state of FIG. 3B to the state of FIG. 3C, the current Ip increases according to a first function, and the current In decreases according to a second function. Conversely, when the control signals Ctrl_p and Ctrl_n of the differential signal offset adjustment circuit 20 are switched from the state of FIG. 3C to the state of FIG. 3B, the current Ip decreases according to the second function, and the current In increases according to the first function. The parameters of the first function and the second function can be adjusted according to the application requirement of the differential signal offset adjustment circuit 20. The parameters of the first function and the second function are stored in the control circuit 40. Therefore, according to the measured signals V3+ and V3−, the corresponding control signals Ctrl_p and Ctrl_n are provided via the first function and the second function, or a look-up table, to the variable current sources XI1 and XI2 of the differential signal offset adjustment circuit 20, to adjust the level of the cross point of the signals V3+ and V3− T; that is, the control signals Ctrl_p and Ctrl_n can control the offset voltage Vos of the differential signal offset adjustment circuit 20.

Figure 3D:
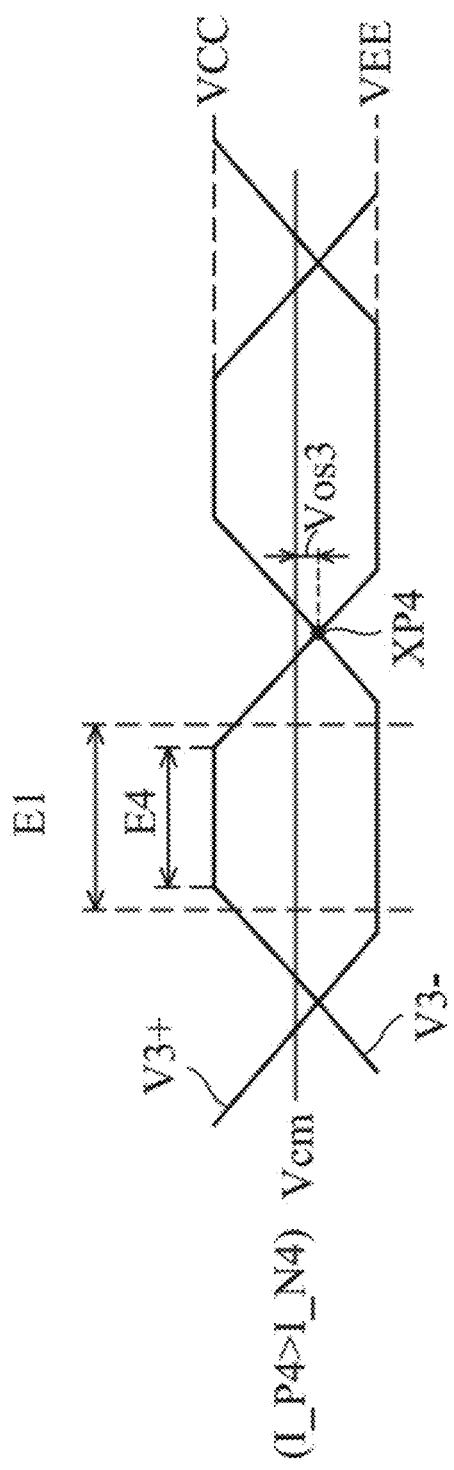

FIG. 3D shows the eye diagram of the output signals V3+ and V3− of the differential signal offset adjustment circuit 20 according to several embodiments of the present invention. In FIG. 3D, the control signals Ctrl_p and Ctrl_n can control the variable current sources XI1 and XI2, so that the current value I_P4 of the current Ip can be higher than the current value I_N4 of the current In; that is, I_P4>I_N4. Therefore, the cross point XP4 of the signals V3+ and the signal V3− can be lower than the common mode voltage Vcm. There is a negative offset voltage Vos3 between the cross point XP and the common mode voltage Vcm; that is, Vos3<0. For the current Ip, the current value I_P4 in FIG. 3D is higher than the current value I_P3 in FIG. 3C; that is, I_P4>I_P3. Furthermore, for the current In, the current value I_N4 in FIG. 3D is lower than the current value I_N3 in FIG. 3C; that is, I_N4<I_N3. When the control signals Ctrl_p and Ctrl_n of the differential signal offset adjustment circuit 20 are switched from the state of FIG. 3C to the state of FIG. 3D, the current Ip increases according to the first function, and the current In decreases according to the second function. Conversely, when the control signals Ctrl_p and Ctrl_n of the differential signal offset adjustment circuit 20 are switched from the state of FIG. 3D to the state of FIG. 3C, the current Ip decreases according to the second function, and the current In increases according to the first function. The period during maintaining the signal V3+ at the voltage of the power supply line VCC is E4, and the period E4 is less than the period E1 of the first mode; that is, E4<E1.

Figure 3E:
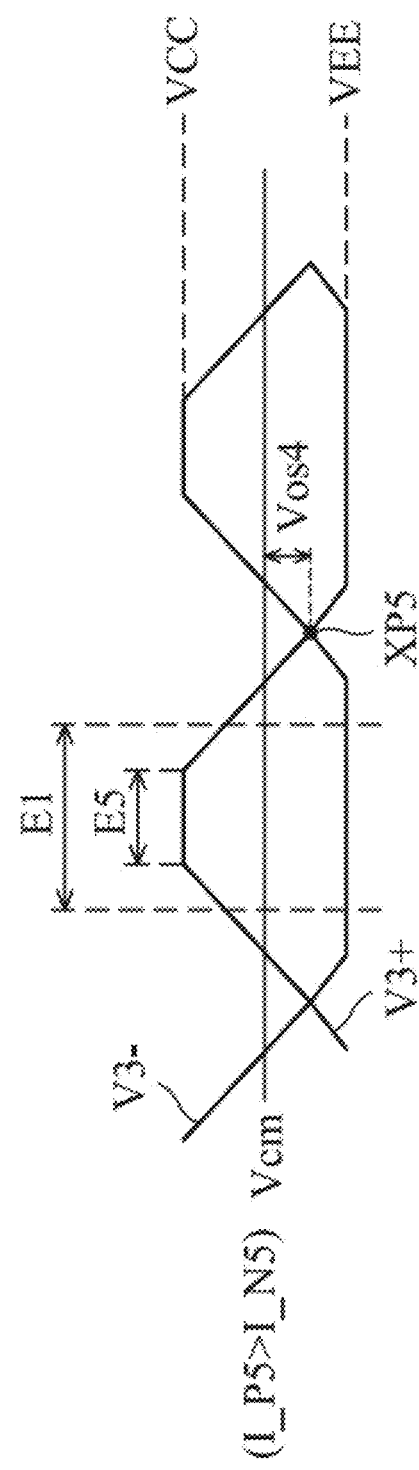

FIG. 3E shows the eye diagram of the output signals V3+ and V3− of the differential signal offset adjustment circuit 20 according to several embodiments of the present invention. In FIG. 3E, the control signals Ctrl_p and Ctrl_n can control the variable current sources XI1 and XI2, so that the current value I_P5 of the current Ip can be higher than the current value I_N5 of the current In; that is, I_P5>I_N5. Therefore, the cross point XP5 of the signals V3+ and V3− can be lower than the common mode voltage Vcm. There is a negative offset voltage Vos4 between the cross point XP and the common mode voltage Vcm; that is, Vos4<0. For the current Ip, the current value I_P5 in FIG. 3E is higher than the current value I_P4 in FIG. 3D; that is, I_P5>I_P4. Furthermore, for the current In, the current value I_N5 in FIG. 3E is lower than the current value I_N4 in FIG. 3E; that is, I_N5<I_N4. When the control signals Ctrl_p and Ctrl_n of the differential signal offset adjustment circuit 20 are switched from the state of FIG. 3D to the state of FIG. 3E, the current Ip increases according to the first function, and the current In decreases according to the second function. Conversely, when the control signals Ctrl_p and Ctrl_n of the differential signal offset adjustment circuit 20 are switched from the state of FIG. 3E to the state of FIG. 3D, the current Ip decreases according to the second function, and the current In increases according to the first function. The period during maintaining the signal V3+ at the voltage of the power supply line VCC is E5, and the period E5 is less than the period E1 in the first mode and the period E4 in the fourth mode, and E5<E4<E1.

Figure 4:
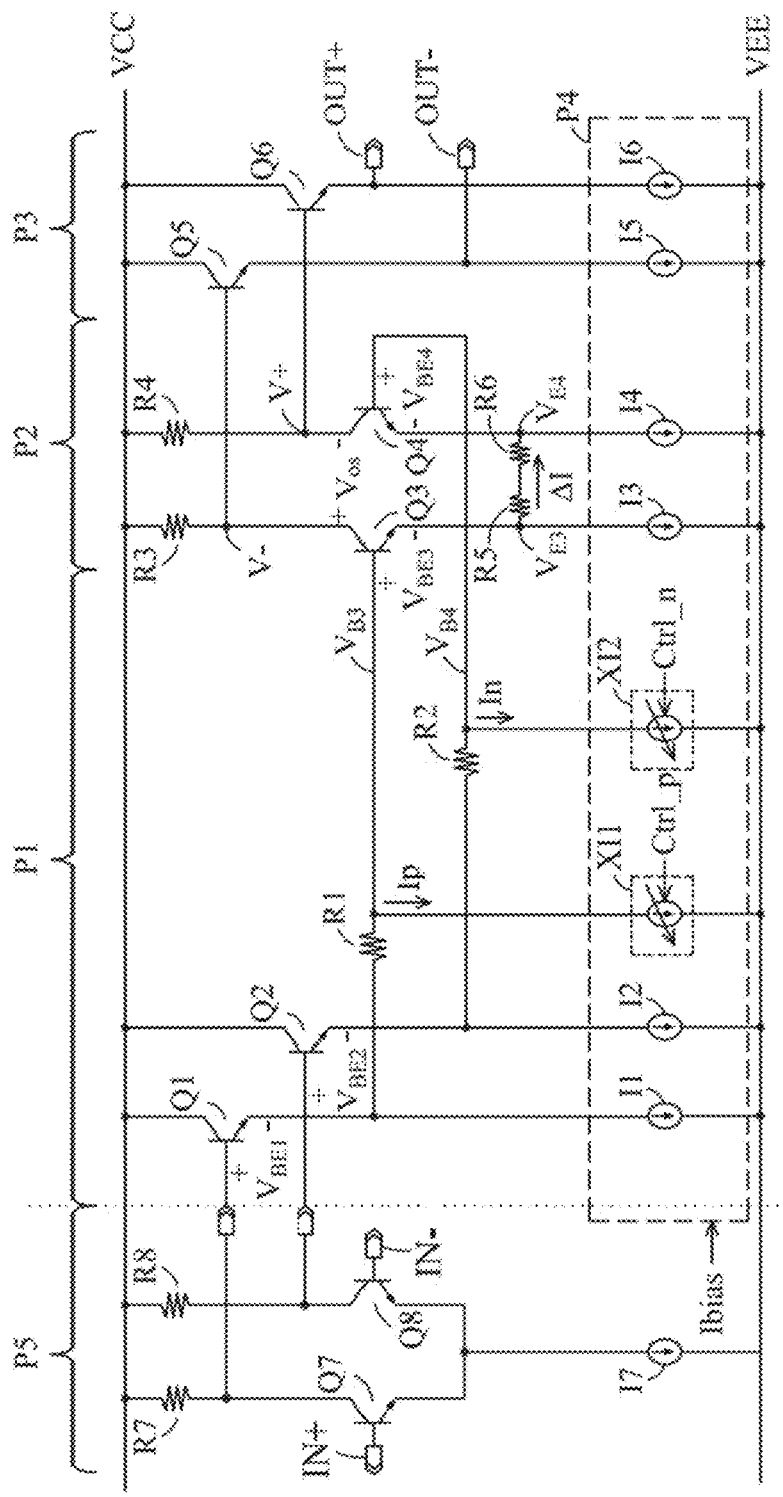
FIG. 4 shows a differential signal offset adjustment circuit according to several embodiments of the present invention

In several embodiments, the differential signal offset adjustment circuit 20 can be integrated in the differential circuit, such as an amplifier, driver or buffer, etc., as shown in FIG. 4. FIG. 4 shows a differential signal offset adjustment circuit according to several embodiments of the present invention. In FIG. 4, the differential circuit 200 includes a differential signal offset adjustment circuit 20 and a pre-circuit portion P5. The pre-circuit portion P5 includes transistors Q7 and Q8, resistors R7 and R8, and current source I7. The resistor R7 is coupled between the power supply line VCC and the transistor Q7, and the resistor R8 is coupled to the power supply line VCC and the transistor Q8. The transistor Q7 is coupled between the resistor R7 and the current source I7, and the base of the transistor Q7 is coupled to the input terminal IN+. The transistor Q8 is coupled between the resistor R8 and the current source I7, and the base of the transistor Q8 is coupled to the input terminal IN−. In several embodiments, the pre-circuit portion P5 is disposed in a previous stage circuit of the differential signal offset adjustment circuit 20, such as the differential amplifier 10 in FIG. 1. In addition, the differential circuit 200 is just an illustrative example, not to limit the scope of the present invention.

Compared with prior circuits that require an operational amplifier for offset adjustment, the differential signal offset adjustment circuit 20 only needs the variable current sources XI1 and XI2 to change the currents Ip and In, to adjust the offset of the output signal. Therefore, compared with the non-linear adjustment of the operational amplifier in the prior circuits, the differential signal offset adjustment circuit 20 can linearly adjust the differential signal offset. In addition, because the variable current sources XI1 and XI2 need fewer components or smaller sizes, the area of the overall circuit can be reduced. In the layout of the present invention, jitter or noise caused by mismatch can be avoided. Furthermore, the differential signal offset adjustment circuit 20 uses the reference current generated by the bandgap circuit for adjustment, which can avoid problems caused by corner effects.

The present invention has been described in considerable detail with reference to certain preferred embodiments thereof. It should be understood that the description is for illustrative purpose, not for limiting the scope of the present invention. An embodiment or a claim of the present invention does not need to achieve all the objectives or advantages of the present invention. The title and abstract are provided for assisting searches but not for limiting the scope of the present invention. Those skilled in this art can readily conceive variations and modifications within the spirit of the present invention.

What is claimed is:

1. A differential signal offset adjustment circuit, comprising:
   a first current source, a second current source, a third current source, a fourth current source, a fifth current source, and a sixth current source;
   a first transistor, coupled between a power supply line and the first current source, the transistor including an input terminal for receiving a first input signal;
   a second transistor, coupled between the power supply line and the second current source, the second transistor including an input terminal for receiving a second input signal, wherein the first and second input signals have the same amplitudes and opposite phases;
   a first variable current source and a second variable current source;
   a first resistor, coupled between the first transistor and the first variable current source;
   a second resistor, coupled between the second transistor and the second variable current source;
   a third resistor, coupled between the power supply line and the third current source;
   a fourth resistor, coupled between the power supply line and the fourth current source;
   a third transistor, coupled between the third resistor and the third current source, the third transistor including an input terminal coupled to the first resistor and the first variable current source;
   a fourth transistor, coupled between the fourth resistor and the fourth current source, the fourth transistor including an input terminal coupled to the second resistor and the second variable current source;
   a fifth transistor, coupled between the power supply line and the fifth current source, to provide a first output signal, the fifth transistor including an input terminal coupled to the third resistor and the third transistor;
   a sixth transistor, coupled between the power supply line and the sixth current source, for providing a second output signal, and the sixth transistor including an input terminal coupled to the fourth resistor and the fourth transistor; and
   at least one fifth resistor, coupled between the third current source and the fourth current source.

2. The differential signal offset adjustment circuit of claim 1, wherein the first variable current source provides a first variable current according to a first control signal, and the second variable current source provides a second variable current according to a second variable current.

3. The differential signal offset adjustment circuit of claim 2, wherein a cross point of the first output signal and the second output signal is determined by the first variable current and the second variable current, wherein the first variable current and the second variable current have different current values.

4. The differential signal offset adjustment circuit of claim 1, wherein the current value provided by the first variable current source, is different from the current value provided by the second variable current source.

5. The differential signal offset adjustment circuit of claim 1, wherein the first current source and the second current source provide the same current values, the third current source and the fourth current source provide the same current values, and the fifth current source and the sixth current source provide the same current values.

6. The differential signal offset adjustment circuit of claim 1, wherein the first to sixth transistors are bipolar transistors or field effect transistors.

7. The differential signal offset adjustment circuit of claim 1, wherein when the current value of the first variable current source is lower than the current value of the second variable current source, the cross point of the first output signal and the second output signal is higher than a common mode voltage of the differential signal offset adjustment circuit; or when the current value of the first variable current source is higher than the current value of the second variable current source, the cross point of the first output signal and the second output signal is lower than the common mode voltage.

8. The differential signal offset adjustment circuit of claim 1, wherein the first resistor and the second resistor have the same resistance values, the third resistor and the fourth resistor have the same resistance value.

9. The differential signal offset adjustment circuit of claim 1, wherein the first transistor and the second transistor have the same dimension, the third transistor and the fourth transistor have the same dimension, and the fifth transistor and the sixth transistor have the same dimension.

10. A differential system, comprising:
    a differential amplifier, for generating a second differential signal pair according to a first differential signal pair;
    a differential signal offset adjustment circuit, for generating a third differential signal pair according to the second differential signal pair, wherein the differential signal offset adjustment circuit includes a first transistor, a second transistor, a first resistor, a second resistor, a first variable current source and a second variable current source, wherein the first resistor is coupled between the first transistor and the first variable current source, and the second resistor is coupled between the second transistor and the second variable current source; and
    a control circuit, for detecting a cross point of the third differential signal pair, and providing a first control signal and a second control signal to the differential signal offset adjustment circuit according to the detected cross point, to adjust the cross point of the third differential signal pair;
    wherein the first variable current source provides a first variable current according to the first control signal, and the second variable current source provides a second variable current according to the second control signal.

11. The differential system, comprising:
a differential amplifier, for generating a second differential signal pair according to a first differential signal pair;
a differential signal offset adjustment circuit, for generating a third differential signal pair according to the second differential signal pair, wherein the differential signal offset adjustment circuit includes a first variable current source and a second variable current source; and
a control circuit, for detecting a cross point of the third differential signal pair, and providing a first control signal and a second control signal to the differential signal offset adjustment circuit according to the detected cross point, to adjust the cross point of the third differential signal pair;
wherein the first variable current source provides a first variable current according to the first control signal, and the second variable current source provides a second variable current according to the second control signal;
wherein the differential signal offset adjustment circuit further includes:
a first current source, a second current source, a third current source, a fourth current source, a fifth current source, and a sixth current source;
a first transistor, coupled between a power supply line and the first current source, and including an input terminal for receiving a first input signal;
a second transistor, coupled between the power supply line and the second current source, and including an input terminal for receiving a second input signal, wherein the first input signal and the second input signal are complementary with the same amplitudes and opposite phases;
a first resistor, coupled between the first transistor and the first variable current source;
a second resistor, coupled between the second transistor and the second variable current source;
a third resistor, coupled between the power supply line and the third current source;
a fourth resistor, coupled between the power supply line and the fourth current source;
a third transistor, coupled between the third resistor and the third current source, and including an input terminal coupled to the first resistor;
a fourth transistor, coupled between the fourth resistor and the fourth current source, and including an input terminal coupled to the second resistor;
a fifth transistor, coupled between the power supply line and the fifth current source, to provide one of the third differential signal pair, and including an input terminal coupled to the third resistor;
a sixth transistor, coupled between the power supply line and the sixth current source, to provide the other of the third differential signal pair, and including an input terminal coupled to the fourth resistor; and
at least one fifth resistor, coupled between the third current source and the fourth current source.

12. The differential system of claim 11, comprising:
a bandgap circuit, for providing a bias current to the differential signal offset adjustment circuit;
wherein, the currents of the first to sixth current sources are generated by mirroring the bias current; and
wherein, the first variable current of the first variable current source is generated by mirroring the bias current and adjusted by the first control signal, and the second variable current of the second variable current source is generated by mirroring the bias current and adjusted by the second control signal.

13. The differential system of claim 12, wherein the cross point of the third differential signal pair is determined by the first variable current and the second variable current, wherein the first variable current and the second variable current have different current values.

14. The differential system of claim 12, wherein the first to fifth resistors and the resistance in the bandgap circuit are made of the same materials.

15. The differential system of claim 11, wherein the first current source and the second current source provide the same current values, the third current source and the fourth current source provide the same current values, and the fifth current source and the sixth current source provide the same current values.

16. The differential system of claim 11, wherein the first to sixth transistors are bipolar transistors or field effect transistors.

17. The differential system of claim 11, wherein when the current value of the first variable current source is lower than the current value of the second variable current source, the cross point of the third differential signal pair is higher than a common mode voltage of the differential signal offset adjustment circuit; or when the current value of the first variable current source is higher than the current value of the second variable current source, the cross point of the third differential signal pair is lower than the common mode voltage.

18. The differential system of claim 11, wherein the first resistor and the second resistor have the same resistance value, and the third resistor and the fourth resistor have the same resistance values.

19. The differential system of claim 11, wherein the first transistor and the second transistor have the same dimension, the third transistor and the fourth transistor have the same dimension, and the fifth transistor and the fifth transistor have the same dimension.

20. The differential system of claim 10, wherein the first variable current and the second variable current have different current values.

* * * * *